United States Patent
Mochida

(10) Patent No.: US 7,741,862 B2
(45) Date of Patent: Jun. 22, 2010

(54) SEMICONDUCTOR DEVICE INCLUDING A SIGNAL GENERATOR ACTIVATED UPON OCCURRING OF A TIMING SIGNAL

(75) Inventor: Yoshifumi Mochida, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 38 days.

(21) Appl. No.: 11/955,790

(22) Filed: Dec. 13, 2007

(65) Prior Publication Data
US 2008/0143371 A1 Jun. 19, 2008

(30) Foreign Application Priority Data
Dec. 14, 2006 (JP) .............. 2006-336590

(51) Int. Cl.
*G01R 31/00* (2006.01)
(52) U.S. Cl. ............ 324/763; 324/765
(58) Field of Classification Search ............... None
See application file for complete search history.

(56) References Cited
U.S. PATENT DOCUMENTS 5,056,094 A * 10/1991 Whetsel ............ 714/736
5,402,063 A * 3/1995 Kim ............ 324/158.1
6,333,879 B1 * 12/2001 Kato et al. ............ 365/201
6,559,669 B2 * 5/2003 Sugamoto et al. ............ 324/763
7,457,179 B2 * 11/2008 Cheon ............ 365/201

FOREIGN PATENT DOCUMENTS

| JP | 06-177251 A | 6/1994 |
|---|---|---|
| JP | 11-163065 A | 6/1999 |

* cited by examiner

Primary Examiner—Vinh P Nguyen
(74) Attorney, Agent, or Firm—Young & Thompson

(57) ABSTRACT

A mode decode/latch circuit decodes an input signal based on a latch timing signal to output a test mode signal to a test execution circuit. Test mode signal line includes a high-resistance portion extending from the mode decode/latch circuit toward the vicinity of the test execution circuit and a low-resistance portion connecting together the distal end of the high-resistance portion and the input of the test execution circuit. A latch circuit for latching the test mode signal based on the latch timing signal is inserted in the low-resistance portion.

7 Claims, 3 Drawing Sheets

SEMICONDUCTOR DEVICE INCLUDING A SIGNAL GENERATOR ACTIVATED UPON OCCURRING OF A TIMING SIGNAL

This application is based upon and claims the benefit of priority from Japanese patent application No. 2006-336590 the disclosure of which is incorporated herein in its entirety by reference.

BACKGROUND OF THE INVENTION (a) Field of the Invention

The present invention relates to a semiconductor device including a signal generator which delivers a fixed output signal in a specific mode, and is activated upon occurring of a timing signal to change the output signal thereof.

(b) Description of the Related Art

Some semiconductor devices include a signal generator which operates upon occurring of a timing signal and does not deliver an active output during a period other than the period of occurring of the timing signal. Examples of such a signal generator include a test-mode signal generator which outputs a test mode signal for starting a test mode of the semiconductor device. In general, an ordinary signal line in a semiconductor device experiences a signal transition thereon along with a normal operation of a circuit component of the semiconductor device. On the other hand, the test mode signal output from the test-mode signal generator is irrelevant to the normal operation, and does not change the level thereof in the normal operation.

A normal signal line, which is active during the normal operation mode of the semiconductor device, is generally made of a low resistance material such as aluminum. On the other hand, a specific signal line, which is inactive in the normal operation mode, such as a test-mode signal line, is often made of a high resistance material such as tungsten. The specific signal line e.g., test-mode signal line may extend in a long distance between the mode-signal generation circuit and a signal receiving circuit such as a test execution circuit. The configuration wherein the specific signal line such as a test-mode signal line is made of the high resistive material is described in Patent Publications JP-1999-163065A and -1994-177251A, for example.

FIG. 3 shows a known semiconductor device including the test-mode signal generator. In this figure, a portion of the semiconductor device is expressed by an equivalent circuit including a coupling capacitance between the test-mode signal line and the normal signal line. A mode decode/latch circuit 201 decodes a code (command) input through an external signal terminal IAi for instructing start of a test mode. The mode decode/latch circuit 201 decodes the input command based on a latch timing signal TMRS occurring at the test mode, and generates a test-mode signal TEST1 based on the contents thus decoded. A signal line 204 is a normal signal line irrelevant to the test mode signal, and in this example, transmits a normal signal /SIG1, which is generated in a buffer 205 by reversing a normal signal SIG1.

A test execution circuit 202 receives the test-mode signal TEST1 output from the mode decode/latch circuit 201 and is controlled thereby. The test-mode signal TEST1 is received by a buffer 206, which outputs a test mode signal /TEST1 after reversing the test-mode signal TEST1, and is used in the test execution circuit 202. A test-mode signal line (TEST1 signal line) 203 for transmitting the test-mode signal TEST1 extends over a long distance from the mode decode/latch circuit 201 to the test execution circuit 202, which is controlled by the test-mode signal TEST1 to execute the test operation of the semiconductor device. The test-mode signal line 203 includes a first portion 203a which is made of a high-resistance material, such as tungsten, and extends over a long distance extending from the mode decode/latch circuit 201 to the vicinity of the test execution circuit 202, and a second portion 203b which is made of a low-resistance material, such as aluminum, and connects the distal end of the first portion 203a to the input of the test execution circuit 202.

Since the TEST1 signal line 203 has a higher resistance, the TEST1 signal line 203 is susceptive to a transition noise occurring on an adjacent signal line. If a normal signal line such as /SIG1 normal signal line 204 is disposed adjacent to the first portion 203a or second portion 203b of the TEST1 signal line 203, the TEST1 signal line 203 receives a transition noise from the adjacent /SIG1 normal signal line 204 upon a transition of the signal thereon and is affected by the transition noise to have a significant potential fluctuation.

FIG. 4 shows the waveform of the above situation in the semiconductor device 200 shown in FIG. 3. In the example of FIG. 3, the test-mode signals TEST1 and /TEST1 are fixed at L-level and H-level, respectively, to maintain the semiconductor device 200 in a normal mode before occurring of a signal transition of the normal signal /SIG1. When the normal signal /SIG1 rises to an H-level during the normal operation mode, the test-mode signal line 203 is affected by the signal transition of the adjacent /SIG1 normal signal line 204 in the vicinity of the distal end, i.e., node N21, of the test-mode signal line 203 due to a capacitive coupling. This causes a potential fluctuation of the test-mode signal TEST1, and if the range of potential fluctuation is large enough to cause a logical inversion of the test-mode signal TEST1 from an L-level to an H-level, as shown by a left dotted circle in FIG. 4, the test execution circuit 202 interprets the logical inversion as occurring of a test mode to control the semiconductor device 200 to operate in the test mode, thereby incurring an error.

On the other hand, if the test-mode signal TEST1 is fixed at an H-level, due to occurring a test mode, the test execution circuit 202 allows the semiconductor device 200 to operate in a test mode. When the normal signal SIG1 rises from an L-level to an H-level in the normal operation, the test-mode signal line 203 is affected by the signal transition of the adjacent /SIG1 normal signal line 204 at the distal end. This causes a potential fluctuation of the test-mode signal TEST1, and if the range of potential fluctuation is large enough to cause a logical inversion of the test-mode signal TEST1 from an H-level to an L-level, as shown by a right dotted circle in FIG. 4, the test execution circuit 202 interprets the logical inversion as occurring of a normal mode to control the semiconductor device 200 to operate in the normal mode, thereby incurring an error.

In general, a typical semiconductor device employs a design configuration wherein the test-mode signal line used for transferring a test mode signal is disposed separately from the normal signal lines, thereby preventing the influence by the operation of the normal signal lines during a normal operation mode. In an alternative or in addition thereto, a shield line is interposed between the test-mode signal line and the normal signal lines, or a buffer is interposed at the interface between the high resistance first portion 203a and the low resistance second portion 203b of the test-mode signal line 203, or the vicinity of the test executing circuit 202 to suppress the fluctuation of the potential of test-mode signal line 203.

FIG. 5 shows an example for suppressing the level fluctuation of the test-mode signal line, as described above. In a portion of the semiconductor device 200a, a shield line 207 fixed at a specific potential, e.g. ground potential, is interposed between the low resistance second portion 203b of the TEST1 signal line 203 and the /SIG1 normal signal line 204. In another portion, a buffer 208 is interposed between the high resistance first portion 203a and another low resistance second portion 203c of the TEST1 signal line 203 or the vicinity thereof FIG. 6 is a waveform diagram showing operation of the semiconductor device 200a shown in FIG. 5. If /SIG1 normal signal line 204 changes the signal level thereof in the normal operation, node N23 of the adjacent shield line 207 may change the potential thereof in response to the influence by the transition noise from /SIG1 normal signal line 204. The potential of node N21 of TEST1 signal line 203 also fluctuates due to the influence by the potential fluctuation of /SIG1 normal signal line 204 and shield line 207; however, the range of potential fluctuation of /TEST1 signal line 203 is by far lower in FIG. 5 than in the case where the shield line 207 is not interposed between /SIG1 normal signal line 204 and /TEST1 signal line 203, as shown by a left dotted circle in FIG. 6. Thus, a logical inversion of /TEST1 signal line 203 does not occur whereby an erroneous operation can be avoided.

In the vicinity of input of the test execution circuit 202b, if /SIG1 normal signal line 204 changes the potential thereof in the normal operation, the potential of node N22 of the adjacent TEST1 signal line 203 fluctuates due to the transition noise of /SIG1 normal signal line 204. However, since node N22 of the low resistance second portion 203c drives the test execution circuit 202b, the range of potential fluctuation of node N22 is smaller in FIG. 5 compared to the case where the buffer 208 is not interposed, whereby erroneous operation can be avoided, as shown in the right dotted line in FIG. 6.

In the technique wherein the test-mode signal line is disposed separately from the normal signal lines as well as the technique using a shield line between the test-mode signal line and the normal signal lines, there is a problem that the layout design of the signal lines consumes a longer time length due to the extraction of each of the test-mode signal lines. There is also a risk wherein it is difficult to correctly extract all the test mode lines from the normal signal lines.

In the technique using a buffer between the high resistance first portion and the low resistance second portion of the test-mode signal line or in the vicinity of the test execution circuit, there is a problem that it is difficult to find a space sufficient for disposing the buffer in the very vicinity of the test execution circuit.

SUMMARY OF THE INVENTION

In view of the above problems in the conventional technique, it is an object of the present invention to provide a semiconductor device including a signal generator which delivers a fixed output signal in a mode, and is activated upon occurring of a timing signal to change the output signal, and which is capable of suppressing the erroneous operation of a signal receiving circuit receiving the specific signal.

The present invention provides a semiconductor device including: a signal generator for generating a specific signal at a timing specified by a timing signal; a signal receiving circuit for receiving the specific signal to execute a specific operation specified by the specific signal; a signal line for transferring the specific signal from the signal generator to the receiving circuit, the signal line including a first portion having a first end connected to the output of the signal generator and a second end, and a second portion having a resistance lower than a resistance of the first portion and connecting together the second end of the first portion and an input of the signal receiving circuit; and a latch circuit inserted in the second portion to latch the specific signal at a timing specified by the timing signal.

The above and other objects, features and advantages of the present invention will be more apparent from the following description, referring to the accompanying drawings.

PREFERRED EMBODIMENT OF THE INVENTION

Figure 1:
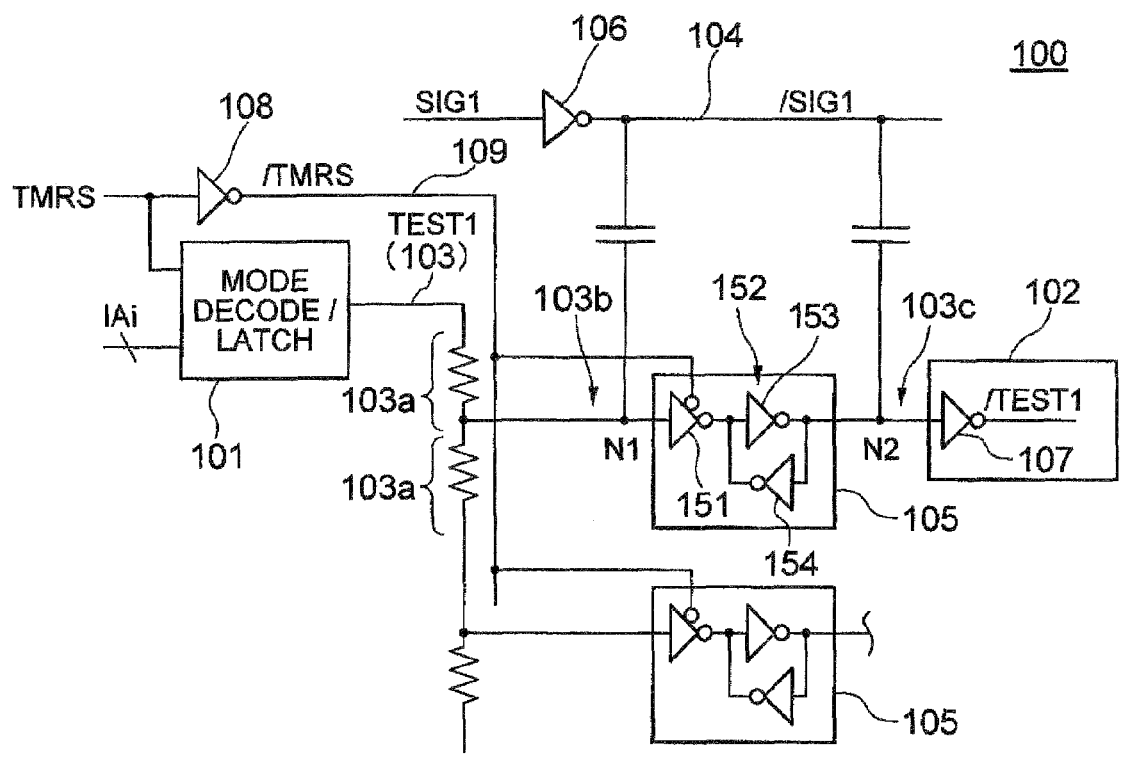
FIG. 1 is a circuit/block diagram of a semiconductor device according to an embodiment of the present invention.

Now, an exemplary embodiment of the present invention will be described with reference to accompanying drawings, wherein similar constituent elements are designated by similar or related reference numerals throughout the drawings.

FIG. 1 shows a semiconductor device according to the embodiment of the present invention. The semiconductor device, generally designated by numeral 100, is configured as a semiconductor memory device, and includes a mode decode/latch circuit (signal generator) 101, test execution circuit (signal receiving circuit) 102, and a latch circuit 105. The mode decode/latch circuit 101 receives an external input signal, i.e., command signal, input through an external input terminal IAi, latches the command at a timing of occurring of a one-shot latch timing signal TMRS indicating start of a test mode, and decodes the command to generate a test-mode signal TEST1 based on the contents of the command.

The test-mode signal TEST1 generated by the mode decode/latch circuit 101 is input to the test execution circuit 102 via a TEST1 signal line 103 transferring the test-mode signal TEST1. In general, a variety of normal signal lines including control signal lines, data lines, address lines, etc. which are used for normal operation are made from a metallic material having a lower resistance, such as aluminum, whereas test-mode signal lines used for controlling the test mode are configured by a metallic line having a higher resistance, such as tungsten, tungsten nitride, titanium nitride etc. In this configuration, it is considered that the test-mode signal lines are not required to operate the semiconductor device at a high speed. The test execution circuit 102 receives the test-mode signal TEST1 output from the mode decode/latch circuit 101, and executes a specific test processing. The test execution circuit 102 receives the test-mode signal TEST1 via a buffer (inverter) 107 as an inverted test mode signal /TEST1.

The TEST1 signal line 103 includes a high-resistance portion 103a extending from the mode decode/latch circuit 101 toward the vicinity of the test execution circuit 102 over a long distance, and a low-resistance portion inserted between the distal end of the high resistance first portion 103a and the input of the test execution circuit 102. A /SIG1 normal signal line 104 is irrelevant to the test mode operation, and transfers a normal signal /SIG1 obtained in a buffer 106 by reversing a normal signal SIG1.

In the present embodiment, a latch circuit 105 which latches the test mode signal TEST1 output from the mode decode/latch circuit 101 is inserted in the low resistance second portion 103b of TEST1 signal line 103. The latch circuit 105 latches the test-mode signal TEST1 based on the timing of a latch timing signal TMRS. In this text, a first section of the low-resistance portion disposed on the input side of the latch circuit 105 is referred to as a first low resistance potion 103b, whereas a second section of the low-resistance portion disposed on the output side of the latch circuit 105 is referred to as a second low-resistance portion 103b. The latch circuit 105 may be inserted at any position of the low-resistance portion, and may be located at a position significantly apart from the input of the latch circuit 105.

The latch circuit 105 includes a switching buffer 151 such as configured by a clocked inverter, and a flip-flop (FF) 152 cascaded from the switching buffer 151. The switching buffer 151 receives a latch timing signal /TMRS at the control input thereof via a buffer (inverter) 108 which reverses the latch timing signal TMRS, to be activated by the latch timing signal /TMRS. The switching buffer 151 outputs test-mode signal /TEST1, which is obtained by reversing test-mode signal TEST1 output from the mode decode/latch circuit 101, in an active state thereof. The switching buffer 151 does not output test-mode signal /TEST1 in an inactive state thereof, and assumes a high-impedance state. In other word, the switching buffer 151 outputs an inverted test-mode signal /TEST1 during only a time interval in which the latch timing signal TMRS assumes an H-level.

The /TMRS signal line 109 transferring the latch timing signal /TMRS from the buffer 108 to the switching buffer 151 is configured by a high resistance signal line such as made of tungsten. In the present embodiment, the length of the /TMRS signal line 109 is equivalent to the length of the TEST1 signal line (103), whereby the skew of the test-mode signal TEST1 is matched with the skew of the latch timing signal /TMRS. A shield line may be disposed adjacent to /TMRS signal line for alleviating the influence by noise from a normal signal line adjacent to the /TMRS signal line. This configuration prevents the switching buffer 151 from being activated in an inadvertent or undesirable timing.

The flip-flop 152 includes a buffer (inverter) 153 which reverses the input signal thereof and another inverter 154 which reverses the output of inverter 153 to resume the original input signal of inverter 153. In consideration of the transition noise from the adjacent signal line, the size of inverters 153 and 154 is determined such that the flip-flop 152 has a relatively lower output impedance. More specifically, the degree of lower output impedance is such that if a transition noise enters from /SIG1 normal signal line 104 to the second low-resistance portion 103c of the test-mode signal line 103, the potential fluctuation of the second low-resistance portion 103c does not cause a logical inversion of test-mode signal /TEST1 on the input of the test execution circuit 102.

The flip-flop 152 reverses the signal output from the switching buffer 151, and maintains the inverted signal therein. Thus, if the switching buffer 151 is in an active state, the flip-flop 152 outputs an inverted signal of the test-mode signal TEST1 output from the switching buffer 151, whereas if the switching buffer 151 is in an inactive state or high impedance state thereof, the flip-flop 152 holds the inverted test-mode signal /TEST1.

Figure 2:
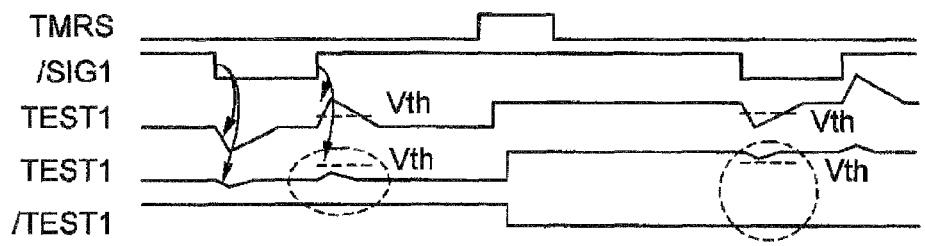
FIG. 2 is a waveform diagram showing operation in the semiconductor device of FIG. 1.
Figure 3:
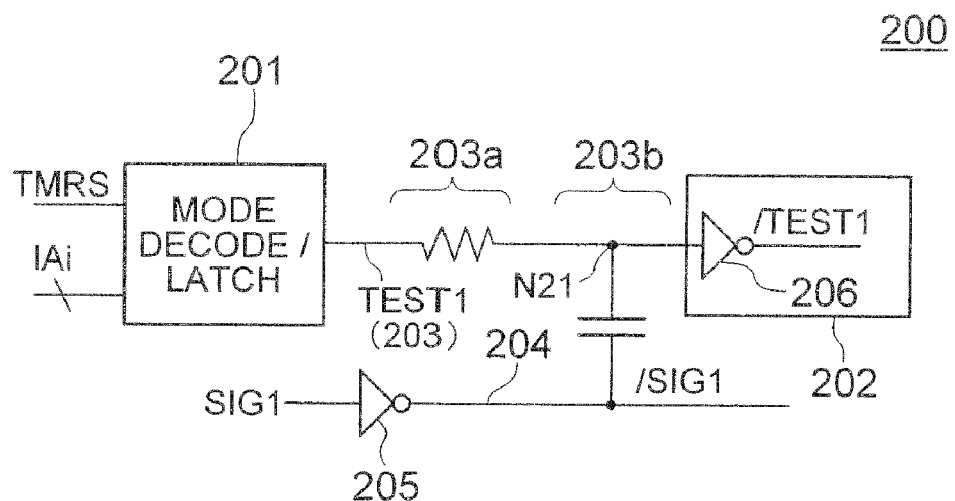
FIG. 3 is a circuit/block diagram of a conventional semiconductor device.
Figure 4:
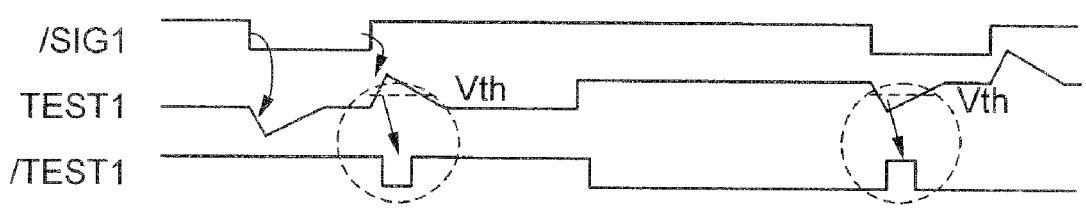
FIG. 4 is a waveform diagram showing operation in the semiconductor device of FIG. 3.
Figure 5:
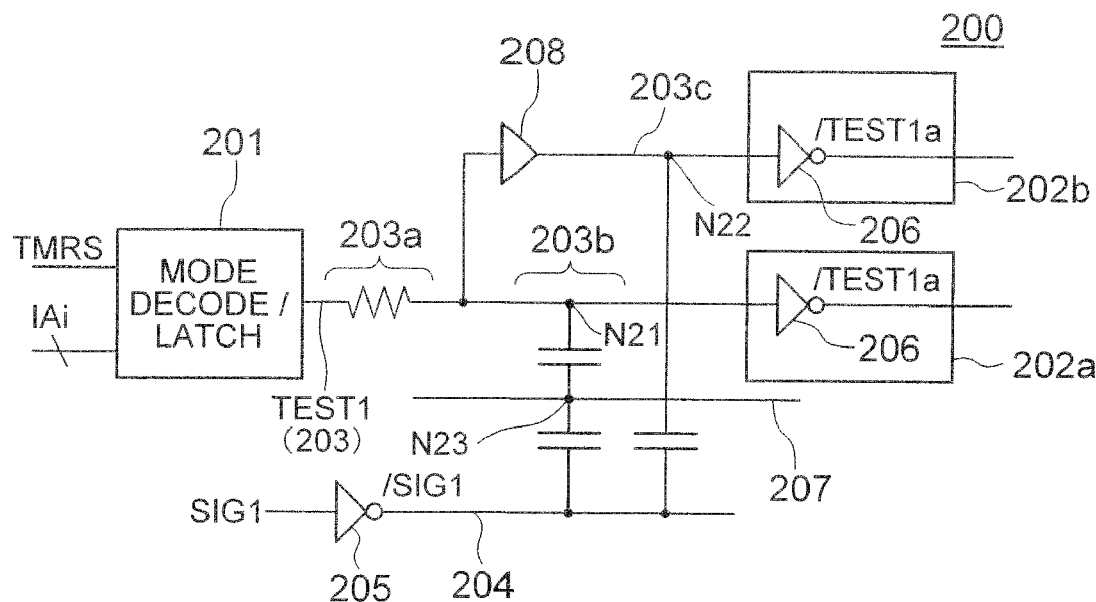
FIG. 5 is a circuit/block diagram of a comparative semiconductor device which is capable of suppressing an influence by a signal transition noise.
Figure 6:
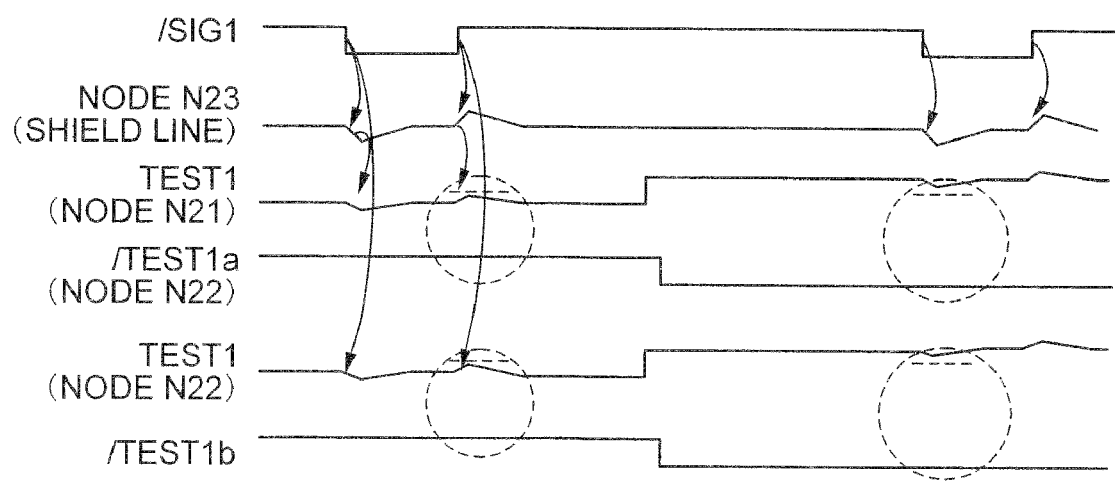
FIG. 6 is a waveform diagram showing operation in the semiconductor device of FIG. 5.

FIG. 2 is a waveform diagram showing operation in the semiconductor device 100 of FIG. 1. It is to be noted that node N1 of the first low-resistance portion 103b of the test-mode signal line 103 and node N2 of the second low-resistance portion 103c are disposed adjacent to /SIG1 signal line 104, the transition noise of which have an influence on the nodes N1 and N2 due to the capacitive coupling. In FIG. 2, the semiconductor device 100 is operating in the normal mode, wherein the latch timing signal TMRS assumes an L-level, and the test-mode signal TEST1 output from the mode decode/latch circuit 101 is maintained at an L-level.

When the normal signal /SIG1 changes from an H-level to an L-level or from an H-level to an L-level, the potential of node N1 on the distal end of TEST1 signal line 103 as viewed from the mode decode/latch circuit 101 fluctuates due to the transition noise from /SIG1 signal line 104. However, since the latch timing signal TMRS assumes an L-level, the switching buffer 151 of the latch circuit 105 is in an inactive state. Thus, even if the potential of node N1 has a large fluctuation to cause a logical inversion thereof, the logical inversion does not incur the logical inversion of output of the switching buffer 151 and flip-flop 152. Thus, the output of flip-flop 152 is maintained at an L-level.

The potential of node N2 of TEST1 signal line 103 between the output of the latch circuit 105 and the test execution circuit 102 may also fluctuate due to the influence of transition noise from /SIG1 signal line. However, since the second low-resistance portion 103c between the output of the latch circuit 105 and the test execution circuit 102 is fixed at an L-level by the flip-flop 152 in the latch circuit 105, and the latch circuit 105 has a lower output impedance, the potential fluctuation of node N2 is small, whereby the potential of node N2 is not inverted by the potential fluctuation. Accordingly, the transition noise of /SIG1 signal line 104 does not incur an erroneous operation of the test execution circuit 102.

Upon a shift of the semiconductor device to a test mode, a one-shot pulse is generated in the latch timing signal TMRS, and the mode decode/latch circuit 101 decodes the input command at this timing, to raise the test-mode signal TEST1 to an H-level. In the latch circuit 105, the switching buffer 151 assumes an active state during the H-level of the latch timing signal TMRS, whereby the output of switching buffer 151 falls to an L-level after the mode decode/latch circuit 101 raises the test-mode signal TEST1 to an H-level.

In general, the timing at which a pulse in generated in the latch timing signal TMRS, SIG1 normal signal line does not change the signal level thereof. Therefore, the potential of node N1 on the input side of the latch circuit 105 is not subjected to the transition noise from SIG1 normal signal line 104 during occurring of the pulse in the latch timing signal TMRS. The flip-flop 152 of the latch circuit 105 changes the output thereof to an H-level upon the fall of output of the switching buffer 151 to an L-level. The test execution circuit 102 starts the test operation due to an H-level of the test-mode signal TEST1 input via TEST1 signal line 103, which allows the test-mode signal /TEST1 to assume an L-level.

If the latch timing signal TMRS falls to an L-level, the switching buffer 151 in the latch circuit 105 is inactivated, and the flip-flop 152 maintains the output thereof at an H-level due to the function of inverters 153 and 154 therein. In this state, if the potential of /SIG1 normal signal line 104 changes from an L-level to an H-level or from an H-level to an L-level, the potential of node N1 may significantly fluctuate due to the transition noise from /SIG1 normal signal line 104. However, since the latch timing signal TMRS assumes an L-level, and the switching buffer 151 is in an inactive state, as in the case of the normal mode, the potential fluctuation of node N1 does not affect operation of the flip-flop 152.

In addition, the potential of node N2 is maintained at an L-level by the flip-flop 152 at an L-level, although the signal level of node N2 may fluctuate due to the transition noise from /SIG1 normal signal line 104. The relatively lower output impedance of the latch circuit 105 reduces the potential fluctuation of node N2. As a result, the output of buffer 107 in the test execution circuit 102 is not reversed by the potential fluctuation of node N2. Therefore, the test execution circuit 102 is not caused to operate in a malfunction by the influence of the transition noise of from /SIG1 normal signal line 104, as in the case of normal mode.

In the present embodiment, the latch circuit 105 for latching the test-mode signal TEST1 based on the latch timing signal TMRS is inserted in the low-resistance portion of TEST1 signal line 103, which is connected to the input of the test execution circuit 102 receiving the test-mode signal TEST1. When the mode decode/latch circuit 101 is inactive, i.e., when the test-mode signal TEST1 assumes an L-level, the switching buffer 151 in the latch circuit 105 is inactive to thereby allow the level of output of the latch circuit 105 to be fixed irrespective of the potential fluctuation of the input thereof. This suppresses the influence by the transition noise from the adjacent signal lines. In addition, since the latch circuit 105 has a lower output impedance, the output of the latch circuit 105 has a lower potential fluctuation. Thus, the test execution circuit 102 does not operate in a malfunction even if the normal signal lines are disposed adjacent to the TEST1 signal line.

In the present embodiment, the switching buffer 151 is inactivated to prevent the potential fluctuation of the input of the latch circuit 105 from affecting the output thereof. Thus, if the potential fluctuation of the low-resistance portion of the test mode signal line exceeds the threshold to cause the logical inversion, the potential fluctuation doers not cause a malfunction of the test execution circuit 102. Thus, the test mode signal line may be disposed adjacent to the normal signal lines without incurring a malfunction. This prevents an increase in the difficulty of layout design for the semiconductor device. The location of the latch circuit 105 is not limited to the interface between the high-resistance portion and the low-resistance portion or vicinity thereof, and the latch circuit may be inserted at any position of the low-resistance portion. This removes the difficulty in the layout design of the semiconductor device.

While the invention has been particularly shown and described with reference to exemplary embodiment and modifications thereof, the invention is not limited to these embodiment and modifications. It will be understood by those of ordinary skill in the art that various changes in form and details may be made therein without departing from the spirit and scope of the present invention as defined in the claims.

What is claimed is:

1. A semiconductor device comprising:
    a signal generator for generating a specific signal at a timing specified by a timing signal;
    a signal receiving circuit for receiving said specific signal to execute a specific operation specified by said specific signal;
    a signal line for transferring said specific signal from said signal generator to said receiving circuit, said signal line including a first portion having a first end connected to said output of said signal generator and a second end, and a second portion having a resistance lower than a resistance of said first portion and connecting together said second end of said first portion and an input of said signal receiving circuit; and
    a latch circuit inserted in said second portion to latch said specific signal at a timing specified by said timing signal.

2. The semiconductor device according to claim 1, wherein said signal generator decodes an external input signal based on said timing specified by said timing signal to generate a mode signal as said specific signal.

3. The semiconductor device according to claim 1, wherein said signal generator operates in a specific mode other than a normal operation mode of said semiconductor device.

4. The semiconductor device according to claim 3, wherein said specific mode is a test mode of said semiconductor device.

5. The semiconductor device according to claim 1, wherein said latch circuit includes a switching buffer for receiving said specific signal from said signal generator, to output said specific signal only during occurring of said timing signal, and a flip-flop for receiving said specific signal from said switching buffer to store therein said specific signal and output the same to said signal receiving circuit.

6. The semiconductor device according to claim 5, wherein said switching buffer reverses said specified signal input from said signal generator and outputs said reversed specified signal during occurring of said timing signal, and stops output of said reversed specified signal during absence of said timing signal.

7. The semiconductor device according to claim 6, wherein said flip-flop includes a first inverter for receiving an output of said switching buffer, and a second inverter for receiving an output of said first inverter to return the same to an input of said first inverter.

* * * * *